United States Patent [19]

Gotoh

[11] Patent Number: 5,258,673
[45] Date of Patent: Nov. 2, 1993

[54] RECTIFIER DEVICE IN VEHICLE AC GENERATOR

[75] Inventor: Hitoshi Gotoh, Hyogo, Japan
[73] Assignee: Mitsubishi Denki K.K., Tokyo, Japan
[21] Appl. No.: 925,213
[22] Filed: Aug. 6, 1992
[30] Foreign Application Priority Data
 Aug. 30, 1991 [JP] Japan .................. 3-246993
[51] Int. Cl.$^5$ .......................... H02K 11/00
[52] U.S. Cl. ................................. 310/68 D
[58] Field of Search ............... 310/64, 68 D, 68 R, 310/52; 363/141, 144; 361/383, 386, 388, 389; 357/81, 79

[56] References Cited

U.S. PATENT DOCUMENTS

| | | |
|---|---|---|
| 4,658,164 | 4/1987 | Gotoh .................. 310/68 D |
| 4,670,678 | 6/1987 | Jäger et al. ............ 310/68 D |
| 4,841,182 | 6/1989 | Tsuchiya et al. ....... 310/68 D |
| 5,043,614 | 8/1991 | Yockey ................. 310/68 D |

FOREIGN PATENT DOCUMENTS 8505756 12/1985 World Int. Prop. O. .

*Primary Examiner*—Steven L. Stephan
*Assistant Examiner*—E. To
*Attorney, Agent, or Firm*—Sughrue, Mion, Zinn, Macpeak & Seas

[57] ABSTRACT

In a rectifier device in a vehicle AC generator, a pair of heat sinks are formed curved with the middle portions of the diode mounting seats thereof parallel-shifted vertically from the remaining end portions, and each of the diode mounting seats has a number of cooling fins, and the cooling fins extended from the middle portions of the diode mounting seats are longer than those extended from the other portions, whereby the heat sinks are increased in heat radiating area and decreased in length.

14 Claims, 4 Drawing Sheets

RECTIFIER DEVICE IN VEHICLE AC GENERATOR

BACKGROUND OF THE INVENTION

This invention relates to a rectifier device in a vehicle AC generator, which converts alternating current generated by the generator into direct current.

FIG. 4 is a sectional view showing a vehicle AC generator equipped with a conventional rectifier device. In FIG. 4, reference numeral 1 designates a stator comprising a stator core 2, and a stator coil 3 wound on the stator core; 4, a rotor comprising a pair of magnetic pole cores 5 and 6 confronted with each other, an exciting coil 7 interposed between those cores 5 and 6, a rotary shaft 8, and slip rings 9 fixedly mounted on the rotary shaft 8 in such a manner that the former are electrically insulated from the latter; 10 and 11, fans mounted on the magnetic pole cores 5 and 6, respectively; 12, a front bracket supporting the stator 1, the front bracket 12 having air sucking holes 12a and air discharging holes 12b; 13, a rear bracket having air sucking holes 13a and air discharging holes 13b, the rear bracket 13 being secured to the front bracket 12 with tightening bolts 14 in such a manner that the stator core 2 is held between the front bracket 12 and the rear bracket 13; 15 and 16, bearings through which the front bracket 12 and the rear bracket 13 support the rotary shaft 8; and 17, a pulley fixedly mounted on one end portion of the rotary shaft 8, the pulley 17 being coupled through belt means to the engine.

Further in FIG. 4, reference numeral 18 designates the rectifier device connected through lead wires to the stator coil 3, the rectifier device 18 adapted to convert polyphase alternating currents into a direct current which is supplied to a DC load such as a battery; and 19, a voltage regulator mounted on the rear bracket together with a brush holder 20. The voltage regulator 19 detects the output voltage of the generator to control the exciting current thereby to maintain the supply terminal voltage at a predetermined value. The brush holder 20 supports brushes 21 in such a manner that the brushes 21 are held pushed against the slip rings 9.

As shown in FIG. 5, a front view of the inside of the rear bracket 13, the rectifier device 18 is mounted on the rear bracket 13 with mounting screws 31a and 31b. In order to receive the mounting screws 31a and 31b, the rear bracket 13 has arcuate protrusions 13c extended radially outwardly therefrom. The brush holder 20 together with the voltage regulator 19 is mounted on the rear bracket 13 with mounting screws 34. The slip rings 9 are surrounded by a cylinder 20 of synthetic resin which is formed integral with the casing of the brush holder 20. A connector 23 is provided in a frame which is formed integral with the casing of the brush holder 20.

The rectifier device 18 is shown in FIG. 6 in more detail. A positive (+) side heat sink 27 (cf. FIG. 7) with positive (+) side diodes 25, and a negative (−) side heat sink 28 (cf. FIG. 7) with negative (−) side diodes 26, together with a wiring board 30, are mounted on the rear bracket 13 with the mounting screws 31a and 31b. The rectifier device 18 further includes three auxiliary diodes 32, and a capacitor 33.

The heat sinks equipped with the diodes as shown in FIG. 6 are illustrated in the parts (A) and (B) of FIG. 7, which are a front view and a side sectional view, respectively. As is apparent from FIG. 7, the diode mounting seats of the heat sinks 27 and 28 are flush with each other and extended parallel with each other. The heat sink 27 has a number of cooling fins 27a, and the heat sink 28 also has a number of cooling fins 28a. The heat sinks 27 and 28 have mounting holes 29a and 29b.

In the conventional rectifier device thus constructed, the diode mounting seats of the heat sinks 27 and 28 are flush with each other as was described above, and in order for the heat sinks to have sufficient heat radiating areas, their length L is necessarily long, and accordingly arcuate protrusions 13c of the rear bracket 13 are unavoidably large. This structure may obstruct the mounting of the AC generator on the engine.

SUMMARY OF THE INVENTION

Accordingly, an object of this invention is to eliminate the above-described difficulties accompanying a conventional rectifier device in a vehicle AC generator.

More specifically, an object of the invention is to provide a rectifier device of a vehicle AC generator in which the heat sinks are increased in heat radiating area, and are decreased in length, and the protrusions of the rear bracket which are extended radially outwardly are made small, when compared with those in the conventional rectifier device, whereby the AC generator can be smoothly mounted on the engine.

The foregoing object and other objects of the invention have been achieved by the provision of a rectifier device for a vehicle AC generator which comprises a pair of heat sinks opposite in polarity whose diode mounting seats are spaced vertically from each other, and a plurality of diodes mounted on each of the diode mounting seats, the heat sinks together with a wiring board being mounted on the rear bracket of the AC generator; in which the pair of heat sinks are formed curved with the middle portions of the diode mounting seats parallel-shifted vertically from the remaining end portions, each of the diode mounting seats having a number of cooling fins in such a manner that the cooling fins of one of the diode mounting seats are extended in the direction opposite to the direction in which the cooling fins of the other diode mounting seat are extended, and the cooling fins extended from the middle portions of the diode mounting seats are longer than the cooling fins extended from the other portions, whereby the heat sinks are decreased in length, and protrusions of the rear bracket which are radially outwardly extended therefrom to receive both ends of the heat sinks when the rectifier is mounted on the rear bracket, is reduced in size.

In the rectifier device, the middle portions of the diode mounting seats are parallel-shifted vertically from the remaining end portions as was described above. This structure increases the heat radiating area of the fins, and decreases the length of the heat sinks. Therefore, the radially outwardly extended protrusions of the rear bracket can be made smaller, and accordingly the AC generator equipped with the rectifier device can be readily mounted on the engine.

The nature, principle, and utility of the invention will be more clearly understood from the following detailed description of the invention when read in conjunction with the accompanying drawings.

BRIEF DESCRIPTION OF THE DRAWING(S)

Figure 2:
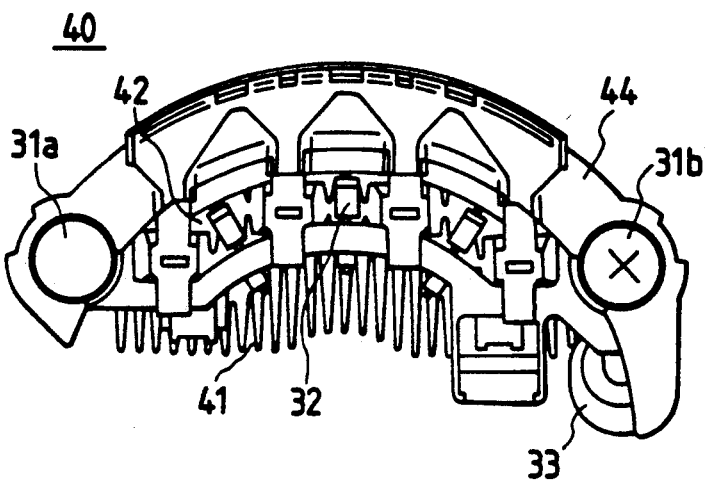
FIG. 2 is a front view of the rectifier device according to the invention.
Figure 3B:
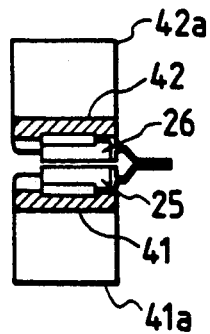
Figure 3A:
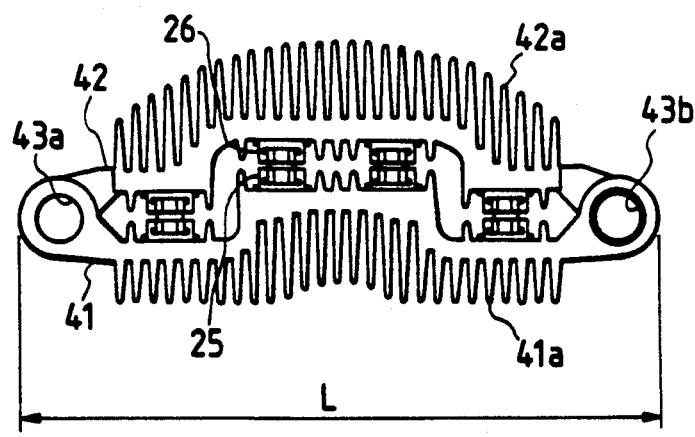
Figure 4:
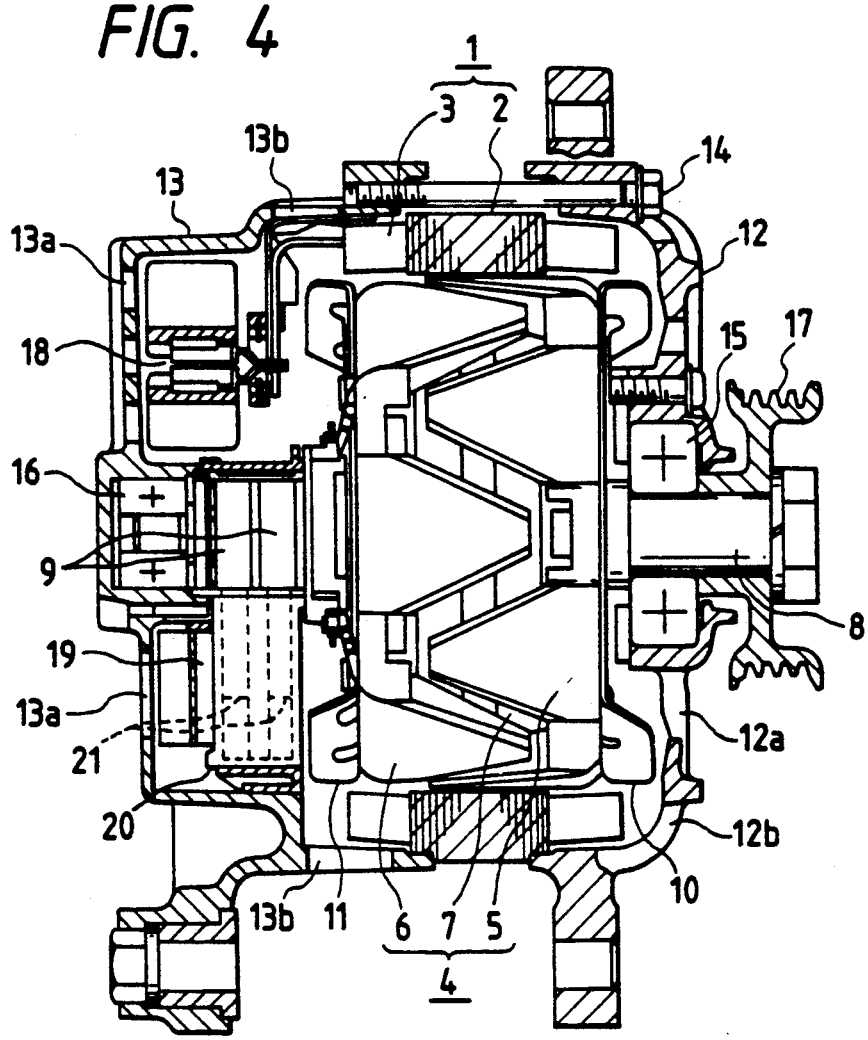
Figure 5:
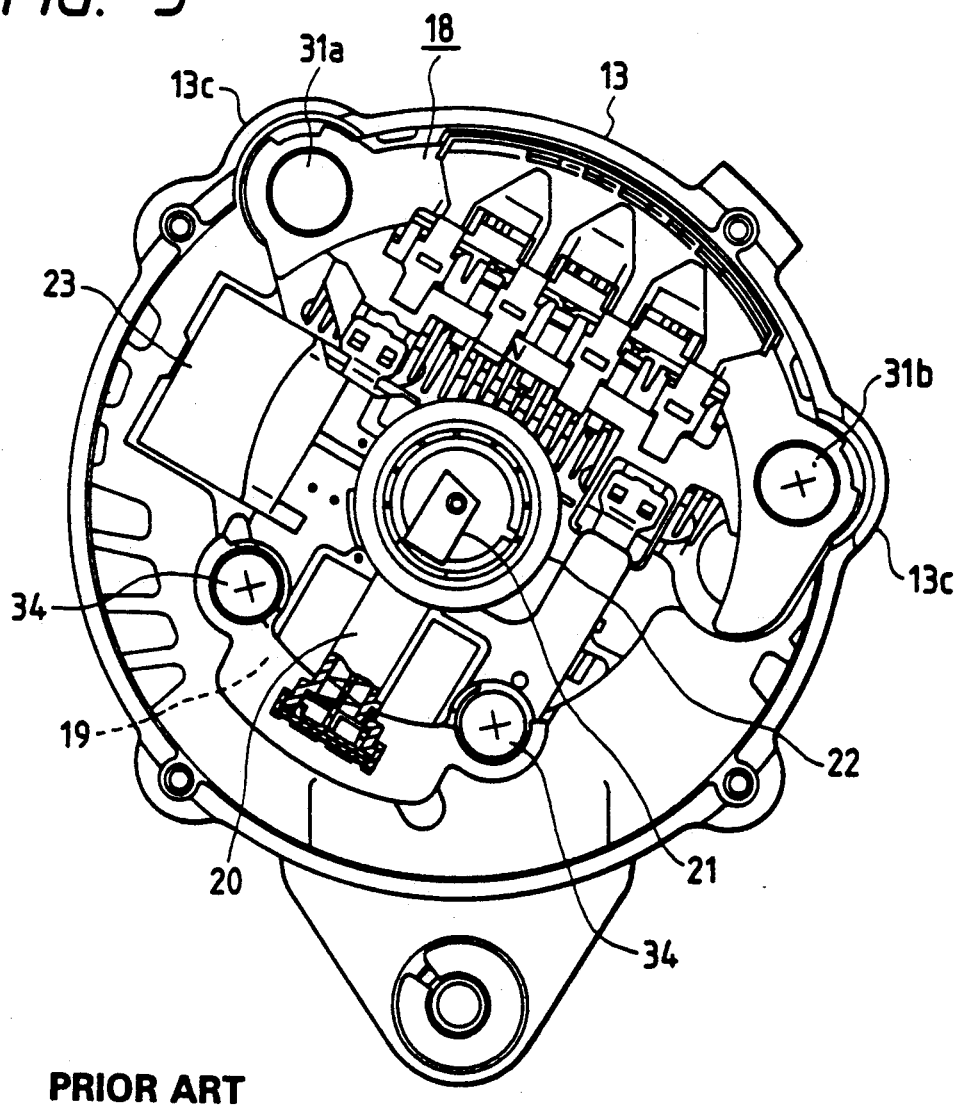
Figure 6:
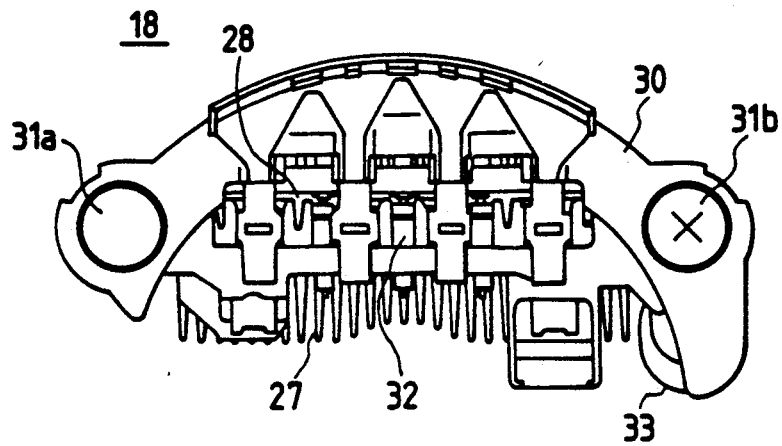
Figure 7B:
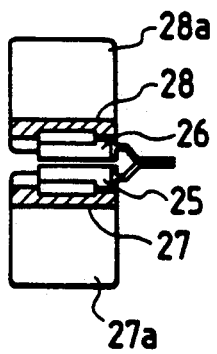
Figure 7A:
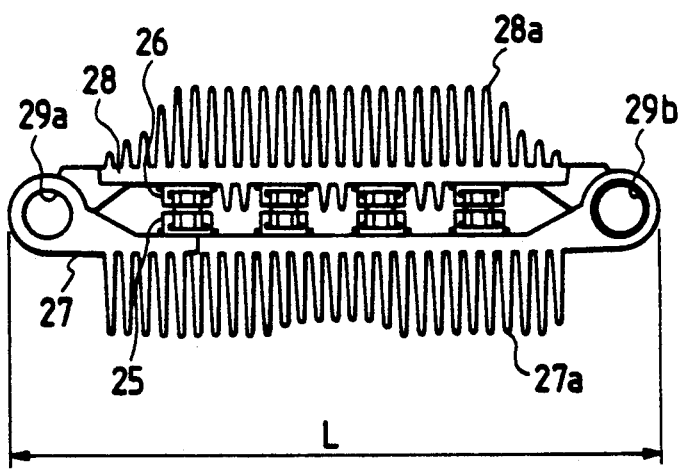

The parts (A) and (B) of FIG. 3 are a front view and a sectional side view, respectively, showing a pair of heat sinks having diodes which form the rectifier device shown in FIG. 2;

FIG. 4 is a longitudinal sectional view showing a vehicle AC generator equipped with a conventional rectifier device;

FIG. 5 is a front view showing the inside of the rear bracket of the AC generator with the conventional rectifier device mounted thereon;

FIG. 6 is a front view of the conventional rectifier device shown in FIG. 5; and The parts (A) and (B) of FIG. 7 are a front view and a sectional side view, respectively, showing a pair of heat sinks having diodes which form the conventional rectifier device shown in FIG. 6.

DETAILED DESCRIPTION OF THE INVENTION

Figure 1:
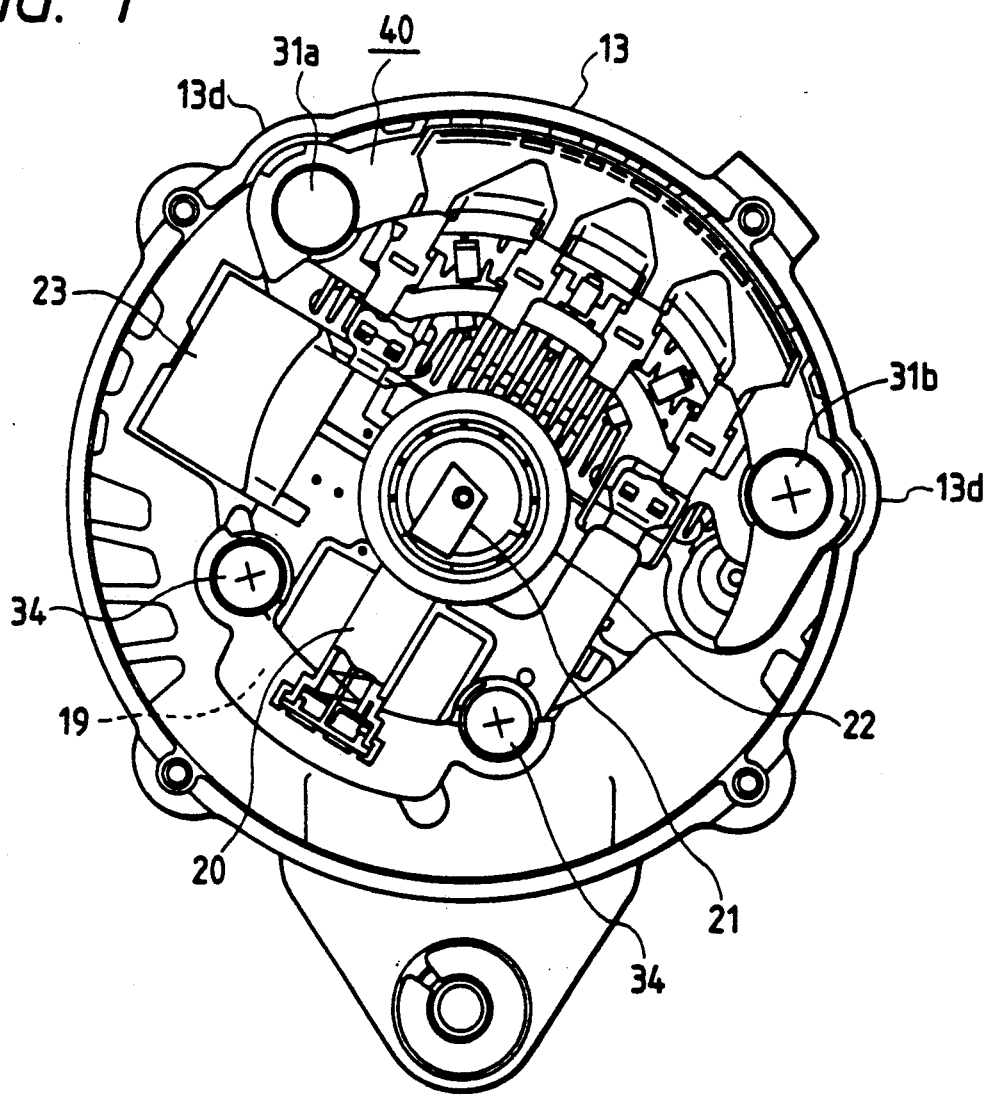
FIG. 1 is a front view of the inside of the rear bracket of a vehicle AC generator equipped with an example of a rectifier device according to this invention.

On example of a rectifier device of a vehicle AC generator according to this invention will be described with reference to FIG. 1. In FIG. 1, reference numerals 13, 19 through 23, 31a, 31b and 34 designate the same components as those in FIG. 5 which shows the conventional rectifier device. The rectifier device 40 is mounted on the rear bracket 13 with the mounting screws 31a and 31b. The length of the rectifier device 40 is shorter than that of the conventional one, and accordingly the protrusions 13d of the rear bracket 13 which are extended radially outwardly therefrom are smaller. The AC generator equipped with the rectifier device 40 is the same as in FIG. 4.

As shown in FIG. 2, a front view of the rectifier device 40, a positive (+) side heat sink 41 (cf. FIG. 3) having positive (+) side diodes 25, and a negative (−) side heat sink 42 (cf. FIG. 3) having negative (−) side diodes 26, together with a wiring board 44, are mounted on the rear bracket 13 with the mounting screws 31a and 31b.

The heat sinks 41 and 42 are shown in the parts (A) and (B) of FIG. 3 in more detail. The heat sinks 41 and 42 are so shaped that the middle portions of the diode mounting seats are parallel-shifted upwardly from the remaining end portions as shown in the part (A) of FIG. 3. The heat sink 41 has a number of cooling fins 41a, and the heat sink 42 also has a number of cooling fins 42a. The heat sinks 41 and 42 have mounting holes 43a and 43b. The end portions of the cooling fins 41a and 42a are tapered. The fins extended from the middle portions of the diode mounting seats, which should be cooled most, are longer than those from the other portions, for improvement of the heat radiating effect. Thus, the length L of the heat sinks 41 and 42 is shorter than that of those in the conventional rectifier device, and accordingly the radially outwardly extended protrusions 13d of the rear bracket 13 is smaller than those in the prior art.

As was described above, in the rectifier device according to the invention, the pair of upper and lower heat sinks whose diode mounting seats are spaced vertically from each other are so designed that the middle portions of the diode mounting seats are parallel-shifted vertically from the remaining portions, and each of the heat sinks has a number of cooling fins, and the fins extended from the middle portions of the diode mounting portions are made longer than the other fins. That is, the heat sinks are formed curved. Hence, the heat radiating area is increased as much, and the length is decreased as much. Accordingly, the radially outwardly extended protrusions of the rear bracket are made smaller. Therefore, the generator equipped with the rectifier device can be installed smoothly on the engine.

While there has been described above the preferred embodiment of this invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A rectifier device in a vehicle AC generator having a rear bracket, comprising:
   a pair of heat sinks, respectively, including diode mounting seats which are spaced vertically from each other, and
   a plurality of diodes mounted on each of said diode mounting seats, said heat sinks together with a wiring board being mounted on the rear bracket of said AC generator,
   wherein said pair of heat sinks have a curvature such that intermediate portions of said diode mounting seats are parallel-shifted vertically from end portions of said heat sinks,
   each of said diode mounting seats having a plurality of cooling fins such that said cooling fins of a first of said diode mounting seats extend in a direction opposite that in which said cooling fins of a second diode mounting seat extend,
   wherein said cooling fins extending from the intermediate portions of said diode mounting seats are longer than said cooling fins extending from other portions of said diode mounting seats,
   whereby said heat sinks are decreased in length, and protrusions of said rear bracket, which are radially outwardly extended therefrom to receive ends of said heat sinks when said rectifier is mounted on said rear bracket, is reduced in size.

2. A rectifier device comprising:
   a pair of heat sinks, respectively, including diode mounting seats spaced vertically from each other for mounting a plurality of diodes thereon, said heat sinks adapted to be mounted on a rear bracket of said AC generator,
   wherein said pair of heat sinks have a curvature such that intermediate portions of said diode mounting seats are parallel-shifted vertically from end portions of said diode mounting seats,
   whereby said heat sinks are decreased in length without decreasing a heat radiating property of said heat sinks,
   wherein each of said diode mounting seats have a plurality of cooling fins such that said cooling fins of a first of said diode mounting seats extend in a direction opposite that in which said cooling fins of a second diode mounting seat extend, and wherein said cooling fins extending from the intermediate portions of said diode mounting seats are longer than said cooling fins extending from other portions of said diode mounting seats.

3. A rectifier device in a vehicle AC generator, comprising:

a pair of heat sinks, respectively, including diode mounting seats spaced vertically from each other for mounting a plurality of diodes thereon, said heat sinks adapted to be mounted on a rear bracket of said AC generator, wherein said pair of heat sinks have a curvature such that intermediate portions of said diode mounting seats are parallel-shifted vertically from end portions of said diode mounting seats, whereby said heat sinks are decreased in length without decreasing a heat radiating property of said heat sinks.

4. The rectifier device according to claim 3, wherein said heat sinks are adapted to be mounted on said rear bracket of said AC generator together with a wiring board.

5. A rectifier device according to claim 3, wherein only said intermediate portions of said diode mounting seats are parallel-shifted from said end portions thereof.

6. A rectifier device according to claim 3, wherein said end portions of said diode mounting seats are positioned in a common plane.

7. A rectifier device for use in a vehicle AC generator, comprising:

a pair of heat sinks, respectively, including diode mounting seats which are spaced apart; and a plurality of diodes mounted on each of said diode mounting seats, wherein said pair of heat sinks have a curvature such that intermediate portions of said diode mounting seats are parallel-shifted vertically from end portions of said diode mounting seats, and each of said diode mounting seats having a plurality of cooling fins such that said cooling fins of a first diode mounting seat extend in a direction opposite that in which said cooling fins of a second diode mounting seat extend, said cooling fins extending from the intermediate portions of said diode mounting seats being longer than cooling fins extending from other portions of said diode mounting seats.

8. A rectifier device according to claim 7, wherein only said intermediate portions of said diode mounting seats are parallel-shifted from said end portions of said diode mounting seats.

9. A rectifier device according to claim 7, wherein said end portions of said diode mounting seats share a common plane.

10. A rectifier device according to claim 8, wherein each of said diode mounting seats have a plurality of cooling fins such that said cooling fins of a first of said diode mounting seats extend in a direction opposite to that in which said cooling fins of a second diode mounting seat extend, and wherein said cooling fins extending from the intermediate portions of said diode mounting seats are longer than said cooling fins extending from other portions of said diode mounting seats.

11. A rectifier device for use in a vehicle AC generator, comprising:

a pair of heat sinks, respectively, having diode mounting seats spaced apart for mounting a plurality of diodes thereon, wherein said pair of heat sinks have a curvature such that only intermediate portions of said diode mounting seats are parallel-shifted vertically from end portions of said diode mounting seats.

12. A rectifier device according to claim 11, wherein said diode mounting seats comprise means for radiating said heat, said heat radiating means comprising cooling fins, at least some of said cooling fins having a length greater than others of said cooling fins.

13. A rectifier device according to claim 12, wherein said cooling fins at said intermediate portions of said diode mounting seats have a length greater than that of said cooling fins at the end portions of said diode mounting seats.

14. A rectifier device according to claim 11, wherein said end portions of said diode mounting seats share a common plane.

* * * * *